US011650171B2

(12) United States Patent
Han et al.

(10) Patent No.: US 11,650,171 B2
(45) Date of Patent: May 16, 2023

(54) OFFCUT ANGLE DETERMINATION USING ELECTRON CHANNELING PATTERNS

(71) Applicant: FEI Company, Hillsboro, OR (US)

(72) Inventors: Han Han, Leuven (BE); Libor Strakos, Brno (CZ); Thomas Hantschel, Houtvenne (BE); Tomas Vystavel, Brno (CZ); Clement Porret, Kessel-Lo (BE)

(73) Assignee: FEI Company, Hillsboro, OR (US)

( * ) Notice: Subject to any disclaimer, the term of this patent is extended or adjusted under 35 U.S.C. 154(b) by 30 days.

(21) Appl. No.: 17/357,409

(22) Filed: Jun. 24, 2021

(65) Prior Publication Data

US 2022/0412900 A1 Dec. 29, 2022

(51) Int. Cl.
*H01J 37/244* (2006.01)
*G01N 23/203* (2006.01)
*H01J 37/28* (2006.01)

(52) U.S. Cl.
CPC .......... *G01N 23/203* (2013.01); *H01J 37/244* (2013.01); *H01J 37/28* (2013.01); *G01N 2223/6116* (2013.01)

(58) Field of Classification Search
CPC ........ H01J 37/22; H01J 37/222; H01J 37/244; H01J 37/252; H01J 37/256; H01J 37/28; G01N 23/203205; G01N 23/2055; G01N 2223/6116
See application file for complete search history.

(56) References Cited

U.S. PATENT DOCUMENTS

| 6,555,832 | B1 | 4/2003 | Ryding et al. |
| 9,678,023 | B2 | 6/2017 | Kim et al. |
| 10,067,078 | B1* | 9/2018 | Zhang ................... H01J 37/222 |
| 10,504,689 | B2 | 12/2019 | Vystavel et al. |
| 2008/0096359 | A1 | 4/2008 | Gupta et al. |
| 2012/0298884 | A1 | 11/2012 | Nakajima et al. |

(Continued)

OTHER PUBLICATIONS

Doucette, "Precise orientation of single crystals by a simple x-ray diffraction rocking curve method," Rev. Sci. Instrum. 76, pp. 036106-1-036106-4 (Mar. 2005).

(Continued)

*Primary Examiner* — Eliza W Osenbaugh-Stewart
(74) *Attorney, Agent, or Firm* — Klarquist Sparkman, LLP

(57) ABSTRACT

Methods and apparatus determine offcut angle of a crystalline sample using electron channeling patterns (ECPs), wherein backscattered electron intensity exhibits angular variation dependent on crystal orientation. A zone axis normal to a given crystal plane follows a circle as the sample is azimuthally rotated. On an ECP image presented with tilt angles as axes, the radius of the circle is the offcut angle of the sample. Large offcut angles are determined by a tilt technique that brings the zone axis into the ECP field of view. ECPs are produced with a scanning electron beam and a monolithic backscattered electron detector; or alternatively with a stationary electron beam and a pixelated electron backscatter diffraction detector. Applications include strain engineering, process monitoring, detecting spatial variations, and incoming wafer inspection. Methods are 40× faster than X-ray diffraction. 0.01-0.1° accuracy enables semiconductor applications.

19 Claims, 12 Drawing Sheets

(56) References Cited

U.S. PATENT DOCUMENTS

2014/0291511 A1 10/2014 Man et al.
2020/0013581 A1* 1/2020 Vystavel ............. H01J 37/2955

OTHER PUBLICATIONS

Han, "Enhancing the defect contrast in ECCI through angular filtering of BSEs," Ultramicroscopy 210 (2020) 112922, pp. 1-12 (Dec. 2019).
Han, "Application of electron channeling contract imaging to 3D semiconductor structures through proper detector configurations," Ultramicroscopy 210 (2020) 112928, pp. 1-10 (Dec. 2019).
Joy, "Electron channeling patterns in the scanning electron microscope," Journal of Applied Physics 53, pp. R81-R122 (Aug. 1982).
Kerns, "Ultra-high spatial resolution selected area electron channeling patterns," Ultramicroscopy 210 (2020) 112915, pp. 1-6 (Dec. 2019).
Wilkinson, "Electron channelling contrast imaging of interfacial defects in strained silicon-germanium layers on silicon," Philosophical Magazine A, 68:1, pp. 59-80 (1993).
"Electron channeling contrast imaging—ECCI," Max-Planck-Institut fur Eisenforschung, available at: https://www/mpie.de/3079126/ECCI, 2 pages, retrieved Sep. 27, 2017.
Kamaladasa et al., "Basic Principles and Application of Electron Channeling in a Scanning Electron Microscope for Dislocation Analysis," Microscopy: Science, Technology, Applications and Education, pp. 1583-1590 (2010).
Phifer et al., "Site-specific 35-minute TEM-lamella preparation by FIB-SEM," European Microscopy Congress 2016: Proceedings, pp. 370-371 (Dec. 2016).
Schmidt et al., "Computer-Aided Determination of Crystal-Lattice Orientation from Electron-Channeling Patterns in the SEM," *Canadian Mineralogist*, 27:15-22 (1989).
Simkin, "Electron Channeling Contrast Imaging (ECCI) Information," available at: http://www.chems.msu.edu/resources/safety/mse-sops/ECCI, 5 pages (2001).
Extended European Search Report from European Patent Application No. 18211937.0, dated May 20, 2019, 10 pages.
Reimer, "Electron Diffraction Methods in TEM, STEM and SEM," *Scanning*, 2:3-19 (1979).

* cited by examiner

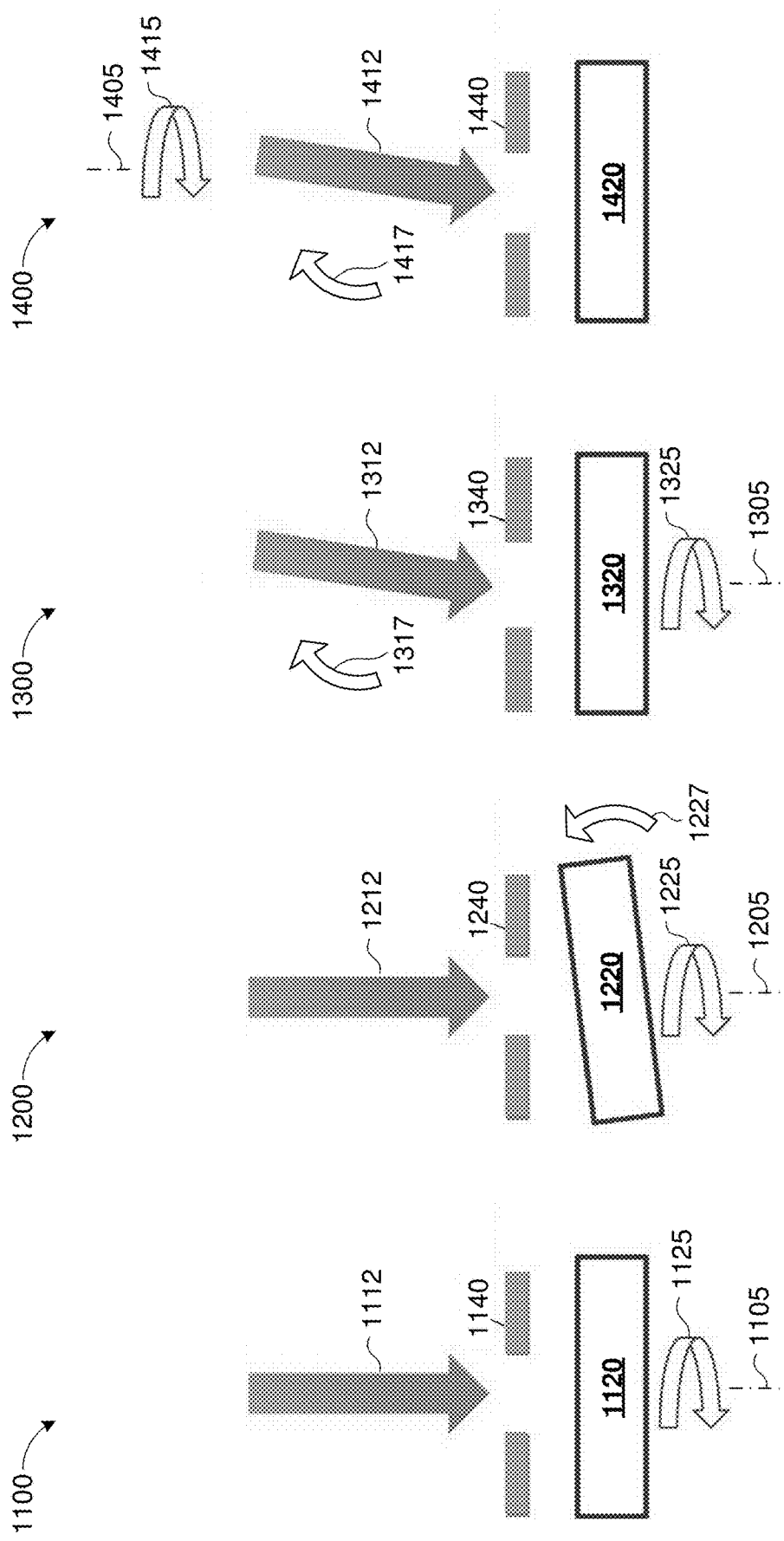

OFFCUT ANGLE DETERMINATION USING ELECTRON CHANNELING PATTERNS

FIELD

The disclosure pertains to determination of crystal orientation of a sample.

BACKGROUND

Crystal orientation can impact performance of semiconductor devices. Conventional techniques of determining the crystal orientation using X-ray diffraction are time consuming. Accordingly, there remains a need for improved technology for determination of crystal orientation.

SUMMARY

Crystal orientation can be characterized by a tilt, known as the "offcut angle," between a major surface of a sample and a principal plane of the sample's crystal structure. In brief, the disclosed technologies provide efficient determination of offcut angle using electron channeling patterns. By rotating a sample through multiple azimuthal setpoints, respective electron channeling patterns (ECPs) can be obtained. A given zone axis of the sample's crystal lattice can describe a circular locus across the multiple ECPs. The offcut angle can be determined as the radius of this circular locus. As an alternative to sample rotation, the electron beam orientation can be azimuthally rotated. In some examples, an ECP at a given setpoint can be obtained by scanning the electron beam over a region of the sample surface, with attendant variations in the angle of incidence of the electron beam as the beam is scanned, and backscattered electrons can be detected by a backscatter electron detector having one or a few segments. In other examples, an ECP at a given setpoint can be obtained with the electron beam held fixed, and an angular distribution of backscattered electrons can be detected using a pixelated electron backscatter diffraction (EBSD) detector. In some situations, the given zone axis can be absent from the field of view of an ECP. A tilt-based technique can be used to bring the zone axis into the field of view.

In a first aspect, the disclosed technologies can be implemented as a method. An electron beam is directed to a substrate at a plurality of azimuthal setpoints. Portions of the electron beam returned from the substrate are detected. Based on the detected portions of the electron beam, respective electron backscatter patterns are produced for each of the azimuthal setpoints. An offcut angle of the sample is determined as a radius of a locus of a zone axis among the electron backscatter patterns.

In some examples, the plurality of azimuthal setpoints includes at least three azimuthal setpoints. The zone axis can be a main zone axis. In further examples, an azimuthal orientation of the offcut angle can also be determined. The azimuthal setpoints can have azimuthal coordinates relative to a reference plane normal to a surface of the substrate. In some examples, the plurality of azimuthal setpoints can be traversed by rotating the substrate. In other examples, the plurality of azimuthal setpoints can be traversed by rotating a centroid of the electron beam relative to the reference plane while the substrate remains stationary. The electron beam can be a scanning electron beam of a scanning electron microscope, and a given pattern of the electron backscatter patterns can be produced by scanning the electron beam across a surface region of the substrate. The detecting can be performed by a pixelated electron backscattering detector.

In additional examples, the directing and detecting can be performed with the electron beam directed to a first location on the substrate, and the method can further include repeating the directing, detecting, producing, and determining operations for a second location on the substrate different from the first location. The directing and detecting can be performed at a first time, prior to a manufacturing operation being performed on the substrate, and the method can further include repeating the directing, detecting, producing, and determining operations after the manufacturing operation.

In further examples, prior to the directing, the electron beam can be applied to the substrate and amounts of the electron beam returned from the substrate can be detected. A first electron backscatter pattern having a field of view can be produced, based on the detected amounts of the electron beam. Responsive to determining that the zone axis is absent from the field of view, a magnification of the electron beam can be reduced.

In a second aspect, the disclosed technologies can be implemented as an apparatus having a rotation stage, an electron beam source, an electron detector, and a controller coupled to at least one of the rotation stage or the electron beam source. The rotation stage is situated to secure a sample having a crystal lattice. The electron beam source is situated to direct an electron beam to the sample. The electron detector is situated to receive portions of the electron beam backscattered from the sample. The controller is configured to vary an azimuthal setpoint at which the electron beam is incident. The azimuthal setpoint has an azimuthal coordinate defined relative a reference plane containing a rotation axis of the rotation stage. The controller is further configured to process the received portions of the electron beam to produce electron channeling patterns, and to determine an offcut angle based on a locus of a zone axis among a plurality of the electron channeling patterns.

In some examples, the apparatus can be integrated with a scanning electron microscope into an analytic instruments, with the scanning electron microscope providing the electron beam source of the apparatus.

In further examples, the electron detector can be a backscatter electron detector having 1 to 16 segments. The electron detector can be a pixelated electron backscatter diffraction detector having at least 100 pixels.

In another aspect, the disclosed technologies can be implemented as computer-readable media storing executable instructions executable by one or more hardware processors. Upon execution of the instructions, the processor(s) can be actuated to: (a) cause an electron beam to be directed to a sample so as to be incident on the sample at a plurality of azimuthal setpoints; (b) obtain associated backscattered electron intensities; (c) process the backscattered electron intensities to produce respective electron channeling patterns for the plurality of azimuthal setpoints; and (d) determine an offcut angle of the sample, based on the electron channeling patterns. The azimuthal setpoints have azimuthal coordinates defined relative to a crystal lattice of the sample.

In some examples, action (d) can include fitting a circle to positions of the given zone axis in the respective electron channeling patterns, and determining the offcut angle of the sample from the radius of the circle. In additional examples, the processors can be further actuated to: (e) determine, at least in part from an initial electron channeling pattern, that a given zone axis of the crystal lattice is not in a field of view of the initial electron channeling pattern; (f) cause a first relative tilt to be applied between the sample and the electron beam; (g) produce a second electron channeling pattern at the first relative tilt, wherein the given zone axis is in a field of view of the second electron channeling pattern; and (h) determine the offcut angle of the sample based at least in part on the first relative tilt. Still further, the processor(s) can be actuated to (i) extract one or more features from the initial channeling pattern; and (j) use the one or more features, and a library of electron channeling data for the crystal lattice, to determine the first relative tilt. Even further, the processor(s) can be actuated to: (k) cause a second relative tilt to be applied between the sample and the electron beam; and (l) produce a third electron channeling pattern at the second relative tilt. Action (h) can include interpolation between, or extrapolation from, the first relative tilt and the second relative tilt, using positions of the given zone axis in the second electron channeling pattern and in the third electron channeling pattern.

The foregoing and other objects, features, and advantages of the invention will become more apparent from the following detailed description, which proceeds with reference to the accompanying figures.

BRIEF DESCRIPTION OF THE DRAWINGS

FIG. 11 is a diagram illustrating a first example configuration for azimuthal rotation according to the disclosed technologies.

FIG. 12 is a diagram illustrating a second example configuration for tilt and azimuthal rotation according to the disclosed technologies.

FIG. 13 is a diagram illustrating a third example configuration for tilt and azimuthal rotation according to the disclosed technologies.

FIG. 14 is a diagram illustrating a fourth example configuration for tilt and azimuthal rotation according to the disclosed technologies.

DETAILED DESCRIPTION

Introduction and Overview

Figure 1:
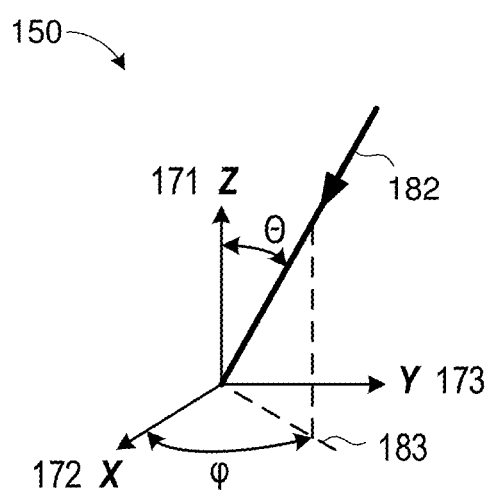
FIG. 1 is a diagram of an example coordinate system for facilitating description of the disclosed technologies.

Crystal orientation can impact the performance of semiconductor devices. It can be desirable to determine the crystal orientation for a number of reasons. First, an incoming semiconductor wafer can be verified to have the offcut angle within a required tolerance. Second, the offcut angle can change during manufacturing processes such as polishing, lapping, or epitaxial growth, and it can be desirable to monitor such changes. Third, control of the offcut angle can be beneficially used for strain engineering of semiconductor devices. Imposition of strain in a transistor channel, e.g. through deliberate crystal misalignment, can improve carrier mobility and channel conductivity. Further, growth of defect-free III-V epilayers can benefit from a controlled non-zero offcut angle of a substrate. Accordingly, it can be desirable to verify that the offcut angle meets a design requirement. Finally, there can be a variation in the offcut angle from one region of a sample to another, and it can be desirable to monitor spatial variation in the offcut angle.

Existing techniques for offcut angle determination utilize X-ray diffraction which provide high accuracy (0.001° to 0.01°) and can take a very long time (10 to 100 hours). The X-ray diffraction techniques are also limited to a maximum offcut angle of about 3°. In contrast, the disclosed technologies can be performed in 15 minutes with a sequence of 12 azimuthal setpoints, and under 5 minutes with just 2 or 3 azimuthal setpoints. Used with standard scanning electron microscopy (SEM) sample stages, the disclosed technologies can provide 0.1° accuracy, which is sufficient for many semiconductor applications. Used with precision goniometers found in an X-ray or electron beam diffraction apparatus, the disclosed technologies can readily provide accuracies of 0.01° or better.

The disclosed technologies utilize electron channeling, a phenomenon whereby backscattering of an electron beam from a crystal lattice can be dependent on the angle of incidence of the electron beam relative to various planes and axes of the crystal lattice. The pattern formed by the backscattered electron current variation with angle of incidence is known as an electron channeling pattern (ECP) or sometimes as Kikuchi lines. The angular dependence of electron backscatter is a crystallographic effect, and the ECP can be used to determine the orientation of the crystal lattice and, in particular, the offcut angle. The disclosed technologies are suitable for monocrystalline materials (e.g. commonly used semiconductor wafers used in microelectronics fabrication), but can also be applied to exposed grains at the surface of a polycrystalline material. Reliability, yield, and performance of manufactured devices can benefit from the disclosed technologies.

Terminology

The usage and meaning of all quoted terms in this section applies throughout this disclosure unless clearly indicated otherwise or repugnant to the context. The terminology below extends to related word forms.

An "analytic instrument" refers to an equipment configured to perform operations on a sample for characterization of the sample. Operations can include delayering, electron backscatter analysis, electron microscopy, etching, imaging, mass spectrometry, material analysis, metrology, nanoprobing, spectroscopy, or surface preparation. Some analytic instruments of interest herein incorporate a scanning electron microscope.

An "azimuthal angle" is a signed angle defined or measured around an axis, from a reference plane containing the axis. The axis can be an axis of rotation, and the azimuthal angle can be varied by performing a rotation about the axis. In some disclosed examples, the axis can be an axis of rotation of a sample stage, which can be normal to a surface of a sample mounted thereon. Thus, an azimuthal angle of an incident electron beam can be varied by rotating the stage about its sample axis. In other disclosed examples, the axis can be an axis of rotation of an electron beam column, and the azimuthal angle of incidence of the electron beam on a sample surface can be varied by rotating the electron beam about the axis of the electron beam column. The reference plane can be normal to a working surface of the sample and can contain the rotation axis of a stage on which the sample is mounted, or the rotation axis of the electron beam column. In further examples, the axis can be defined relative to a crystal lattice of the sample. To illustrate, the axis can be in a [0 0 1] direction of the crystal lattice, and the reference plane can be a [1 0 0] or a [0 1 0] plane. An azimuthal coordinate is analogous to longitude of a terrestrial location.

An "azimuthal setpoint" is a central value of azimuthal angle for an ECP. That is, each ECP can involve a raster scan of an electron beam over a region of interest (ROI) on a sample surface, which in general can vary azimuthal angle and tilt of the electron beam as the raster scan is performed. To illustrate, at an azimuthal setpoint of 30°, the ECP could scan a range of azimuthal angles between 26°-34°. The central value can be a mean, a median, or a centroid value of the instantaneous azimuthal angles over the raster scan, or another central measure. The central value can be the value of the azimuthal angle with electron scanning coils turned off or in a default state. In a diffraction configuration where the electron beam is held stationary, the azimuthal setpoint and the instantaneous azimuthal angle can be one and the same.

A "backscatter electron detector" (or simply "BSD") is a device to collect electrons (dubbed "backscatter electrons" or "BSE") elastically scattered from a surface region of a sample irradiated with an incident electron beam. A BSD can be coupled to an ammeter to measure the BSE current. The BSE current can be used to form an image, either as a common SEM image showing BSE current as a function of spatial position on a sample surface, or as an ECP image showing BSE current as a function of angular orientation of the incident electron beam relative to the crystal lattice of the sample. A BSD can be configured as an annulus about a central aperture through which the incident electron beam passes. A BSD can be configured as a single segment or as multiple radial segments, the number of such segments being in a range 2-8, 9-16, or 17-32. Common BSDs can subtend a relatively large solid angle as seen from the point at which the electron beam is incident on a sample surface: solid angles between 1-2 steradians, between $0.5\pi$ and $\pi$ steradians, or between $\pi$ and $2\pi$ steradians can be used. However, the use of a large solid angle BSD is not a requirement, and the disclosed technologies can be used with 1-16 spot electron detectors.

The term "current" refers to an electrical current, commonly the current of an electron beam incident on a sample, or the backscattered electron current redirected from the sample and received at an electron detector. Where measurement of current is described, the current can be measured directly, e.g. using an ammeter, or indirectly by accumulating current over a time interval and measuring the resulting accumulated charge.

An "electron channeling pattern" ("ECP") is a two dimensional distribution of backscattered electron current as a function of angles, commonly an X-Tilt angle and a Y-Tilt angle. As described further herein, the angular variables can be coordinates of the angle of incidence of an electron beam at a sample surface, or can be coordinates of the diffraction angle of backscattered electrons. An ECP can be presented as an image ("ECP image") but this is not a requirement, and some aspects of the disclosed technologies can be performed using underlying ECP data without generation of an image. Calibration can be applied in the production of ECPs. Scanned positions of raw data can be converted to tilt angles based on the Bragg diffraction condition, which can be calculated for known materials. For unknown materials, calibration of angular coordinates can be done using a reference sample of a known material (e.g. a Si wafer) at the same working distance, beam energy, and beam current.

"Electron backscatter diffraction" ("EBSD") is a phenomenon of electron backscatter current varying as a function of detection angle. An EBSD detector can be a pixelated detector, with a number of pixels being in a range 33-64, 64-256, 100-10,000, 10,000-1,000,000, or up to 100 million. EBSD detectors, BSDs, Everhart-Thornley detectors, Faraday cups, or other charge collection devices are collectively referred to as "electron detectors" herein.

An "electron beam" is a directional flow of electrons.

A "field of view" is two dimensional extent covered by an image or a pattern. In some disclosed examples, the image or pattern can be an electron channeling pattern (ECP) and the two dimensional extent can be a solid angle. In other examples, a field of view can be a region of interest (ROI) on a sample surface, over which an SEM electron beam is scanned.

An "offcut angle" is the tilt between a principal plane of a sample's crystal lattice and a major surface of the sample. In some examples, the sample can be a single crystal silicon wafer (or a wafer of another semiconductor material) and the offcut angle can be dubbed a "wafer offcut angle." In other examples, an offcut angle can be specific to a grain of a polycrystalline material. Offcut angle can vary from sample to sample, can vary between spatial regions of a given sample, or can vary over time as a result of manufacturing or analytic processes. Processes such as annealing, delayering, deposition, etching, or polishing can change the surface planes of a sample or can change the crystal structure of the sample. For strain engineering, an offcut angle can be applied along a specific crystallographic direction to obtain a desired mode of crystal growth and desired layer properties.

A "pattern" is a plurality of data values indicating a spatial variation of a physical quantity. The physical quantity can be backscattered electron current, and the pattern can be an electron channeling pattern (ECP). The spatial variation can be a variation according to position and/or according to orientation. In some examples, a pattern can be an image, but this is not a requirement and, in other examples, the pattern can include a regularly-spaced or irregularly-spaced subset of the data values required to form a complete image.

A "region of interest" (ROI) is a portion of a sample surface over which an electron beam is scanned. The term ROI does not refer to any human interest.

The term "rotate" refers to an action which changes the azimuthal orientation of an electron beam with respect to a sample upon which the electron beam is incident. The rotation can be performed by changing the electron beam orientation or by changing the sample orientation. In the disclosed examples, a rotation can be a "pure rotation", i.e. having a fixed point in the sample reference frame (if the sample is moved) or in the electron beam reference frame (if the electron beam is moved). However, this is not a requirement, and rotation does not preclude an accompanying translation.

The term "scan" (as a noun or verb) refers to traversal of an operational parameter over a continuous or discrete set of values (the discrete values being dubbed "scan points"). A scan is often accompanied by one or more measurements. As an example, an electron beam position can be scanned (e.g. a raster scan) over a region of a sample surface. As another example, a series of ECPs can be obtained by a scan over a sequence of azimuthal setpoints. As a further example, ECPs can be acquired over a sequence of tilt setpoints to find a setting for which a desired zone axis is present within the ECP field of view.

A "scanning electron microscope" is an instrument combining an electron beam with controls to scan the electron beam in one or more transverse directions to perform imaging or some other analytic function on a substrate. A scanning electron microscope is a system for performing scanning electron microscopy (SEM). An SEM system can be used as a stand-alone imaging instrument, or can be integrated with other analytic equipment, such as a nanoprobe system, or with other process equipment, such as a focused ion beam tool.

A "stage" is an apparatus to which a sample can be attached and having actuators for adjusting a position or orientation of the sample. A stage can have a fixture ("sample mount") for holding the sample fixed on the stage. A "rotation stage" has a capability to rotate a sample mounted thereon through a range of azimuthal angles. A "tilt stage" has a capability to adjust the tilt of a sample mounted thereon, and a "translation stage" has a capability to translate a sample mounted thereon. The designation of a stage as a "rotation stage," "tilt stage," or other type of stage does not preclude other types of spatial adjustment. Particularly, a "multi-axis stage" has multiple degrees of freedom, offering spatial adjustment of a sample in varying combinations of translation or orientation.

A "substrate" is a physical object that can be subject to an analytic procedure with a beam or probe or other analytic equipment as described in this disclosure. The term "sample" can be used interchangeably. Often, a substrate can have a "major surface" exposed to the beam or probe, which is a surface of the substrate whose area is not substantially exceeded by any other surface of the substrate. A "planar substrate" is a substrate having parallel major surfaces (e.g. having constant thickness), commonly the top and bottom surfaces. Thus, with the bottom surface of a planar substrate secured confidential onto a top mounting surface of a rotation stage whose rotation axis is perpendicular to the mounting surface, the normal to the top surface of the substrate is parallel to the rotation axis, and remains invariant as the stage is rotated.

A "tilt" (as a noun) or "polar angle" is an unsigned angle defined or measured going away from an axis. As for azimuthal angles, the axis can be an axis of rotation, or a direction defined relative to a crystal lattice of a sample. The tilt polar angle is analogous to the complement of the latitude of a terrestrial location—i.e. polar angle is equal to 0° at the North Pole (where latitude is 90° N), and equal to 90° at the equator (where latitude is 0°). In disclosed examples, tilts of interest can be between a rotation axis of a stage, a crystal axis of a sample mounted on the stage, or an axis of an electron beam incident on the sample. Like azimuthal angle, a tilt is a relative angle, and tilt can be changed either by tilting the sample or by tilting the electron beam. As a verb, "tilt" refers to an action that increases or decreases the tilt angle.

A "zone axis" is a direction having symmetry in a crystal lattice. In disclosed examples, offcut angle of a sample is determined from the locus of a zone axis in ECP over a set of azimuthal setpoints. While in principle an arbitrary zone axis can be selected and tracked for this purpose, it can be convenient to select and track a zone axis close to a surface normal of the sample in order to obtain the zone axis within the ECP field of view. In some examples, a zone axis within 1°, within 2°, within 5°, or within 10° of the surface normal can be used.

The terms "top," "bottom," "up," "down," "above," "below," "horizontal," "vertical," and the like are used for convenience, with respect to a common configuration in which a vertical electron beam is incident on a top surface of a sample. One of ordinary skill will understand from this disclosure that a choice of actual orientation can be varied without departing from the scope of the disclosed technologies.

Example Coordinates

FIG. 1 is a diagram 150 of an example coordinate system for facilitating the description of the disclosed technologies. The coordinate system has mutually orthogonal Z, X, and Y axes 171, 172, 173 as shown. Z axis 171 can be normal to a top surface of a sample. For a planar sample and an aligned apparatus, the Z axis can also be parallel or the stage rotation axis or an axis of cylindrical symmetry of an electron beam column. The X and Y axes can be arbitrarily located in the plane of the top surface of the sample.

Vector 182 can point in the direction of an electron beam incident on the top surface of the sample. As shown, the electron beam direction 182 can be tilted by a tilt angle θ relative to the Z axis 171. Additionally, electron beam direction 182 can have an azimuthal orientation around the Z axis 171, which can be defined relative to the XZ plane. That is, the projection 183 of vector 182 on the XY plane can have an angle φ from the X axis. The choice of the XZ plane as the reference plane is arbitrary. In varying examples, the YZ plane (or another plane containing the Z axis) can be used as the reference plane.

ECPs described herein are presented with angular coordinates such as X-Tilt and Y-Tilt. X-Tilt describes a tilt angle in the XZ plane, measured from the Z axis. Y-Tilt describes a tilt angle in the YZ plane, also measured from the Z axis.

Principle of Operation and First Example Application

Electron backscattering from a crystalline material is found to depend on the relative orientation between the electron path and the crystal lattice. Two effects are observed. First, as angle of incidence of the electron beam is varied, the total amount of electron scattering varies with the angle of incidence. This effect can be observed by scanning an SEM beam across the sample surface and measuring backscattered electrons, e.g. with a BSD. A second effect is the inverse of the first: a stationary electron beam can generate backscattered electron intensity which is angle dependent. This effect can be regarded as diffraction and can be observed with a stationary incident electron beam, by measuring backscattered electrons with a pixelated EBSD detector. For both effects, the backscattered electron intensity (current or charge) can be presented as a function of angular orientation (with two degrees of freedom dubbed X-Tilt and Y-Tilt) in an electron channeling pattern (ECP). As described herein, an ECP can be in the form of an image (ECP image) or can simply be the underlying stored data.

In some examples, the intensity of electron backscatter is found to be higher when Bragg diffraction condition is satisfied. Higher backscatter intensity can occur when an axis of symmetry of the crystal lattice is aligned with the incident electron beam (first effect: scanning electron beam) or with the scattered electrons (second effect: diffraction). These intensity peaks manifest as spots (square or another cross-section, depending on the crystal structure) in an ECP. Secondary extrema of intensity can be observed when the incident electron beam or the scattered electrons are aligned with a plane of the crystal lattice—lower order planes such as (1 0 0) providing deeper extrema than high order planes such as (2 3 4). These secondary peaks can manifest as bright or dark lines or bands in an ECP. Because the ECP features depend on the crystal orientation, either the first effect or the second effect can be used to determine the crystal lattice orientation.

Figure 2:
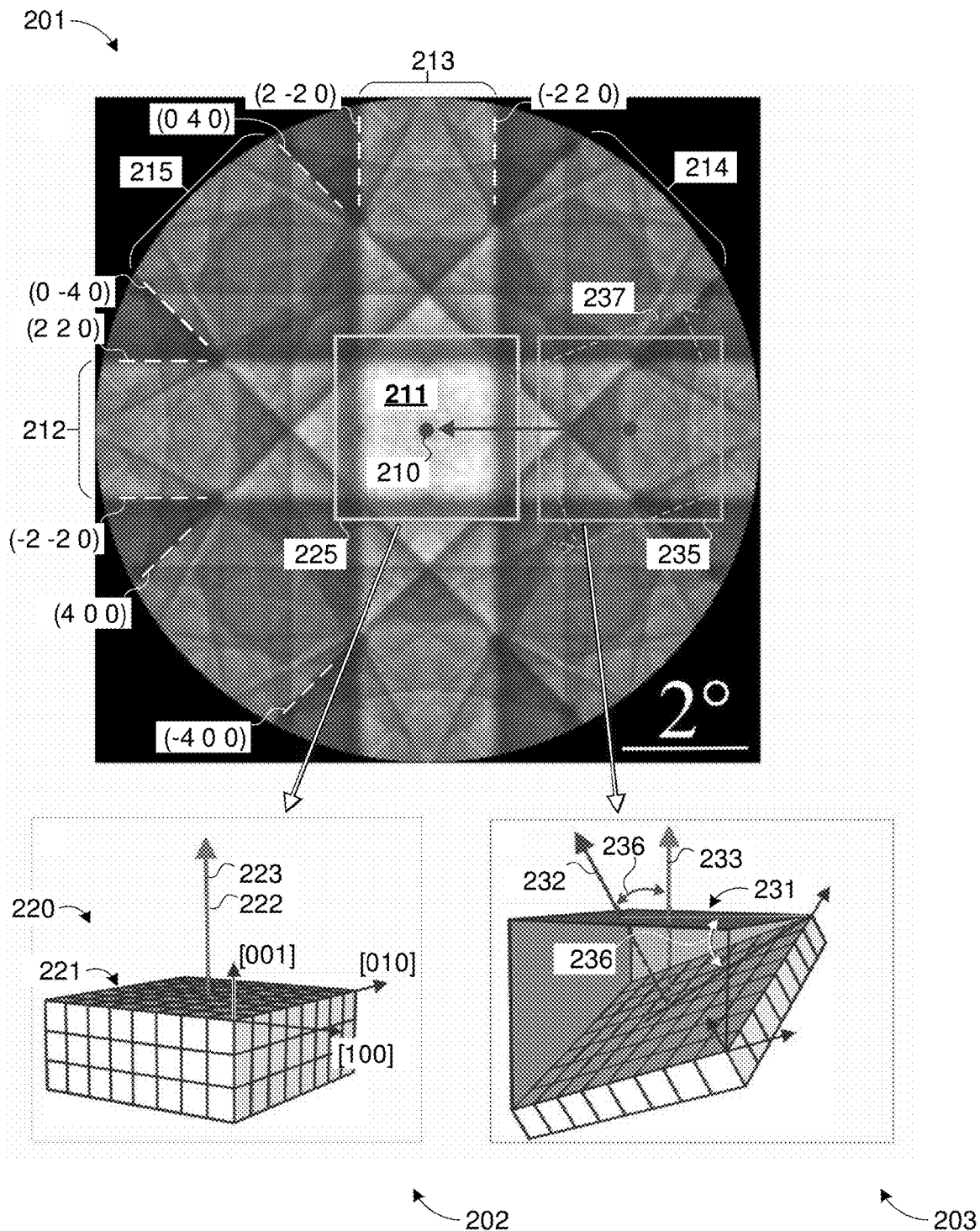
FIG. 2 is a diagram illustrating a relationship between offcut angle and electron channeling pattern applicable to examples of the disclosed technologies.

FIG. 2 is a diagram illustrating a relationship between the offcut angle and electron channeling pattern applicable to examples of the disclosed technologies. ECP image 201 is a simulation of electron channeling centered on a [0 0 1] axis of a monocrystalline silicon wafer. The bright square 211 in the middle is aligned with the [0 0 1] axis, and is the intersection of the bands 212, 213 in ECP 201. Band 212 can be found between (2 2 0) and (−2 −2 0) planes, while band 213 can be found between (2 −2 0) and (−2 2 0) planes as shown. Bright square 211 is also within the intersection of bands 214, 215. Band 214 can be found between (4 0 0) and (−4 0 0) planes, while band 215 can be found between (0 4 0) and (0 −4 0) planes as shown. Various other bright or dark features correspond to other higher-order axes or planes in the silicon crystal. Inset 202 shows a crystal 220 having zero offcut. That is, the top surface 221 of crystal 220 is a (0 0 1) plane, and the [0 0 1] zone axis 222 is aligned with the surface normal 223. An ECP image of this crystal can be centered on the [0 0 1] zone axis and can appear (for a suitable electron beam scan) generally as shown within square 225. Particularly, the orientation of zone axis 222 on the crystal 220 and the position 210 in the ECP image remain unchanged as crystal 220 is rotated about surface normal 223.

Inset 203 shows another crystal 230 having an offcut 236. The top surface 231 of crystal 230 is not aligned with the (0 0 1) plane, but is tilted by offcut angle 236. An ECP image of this crystal is offset from the [0 0 1] zone axis 232 and can appear (for a suitable electron beam scan) generally as shown within square 235. As crystal 230 is rotated azimuthally about surface normal 233, the orientation of zone axis 232 can precess around surface normal 233 and, correspondingly, the ECP image can rotate about the rotation center 211, as indicated by in dashed-outline square 237. As illustrated, zone axis 210 is outside the field of view of ECP images 235, 237. However, if the field of view is increased, so that zone axis 210 is within field of view of an ECP image of crystal 230, then zone axis 210 can follow a circular locus as ECP image 235 rotates azimuthally to 237 and beyond.

Figure 3:
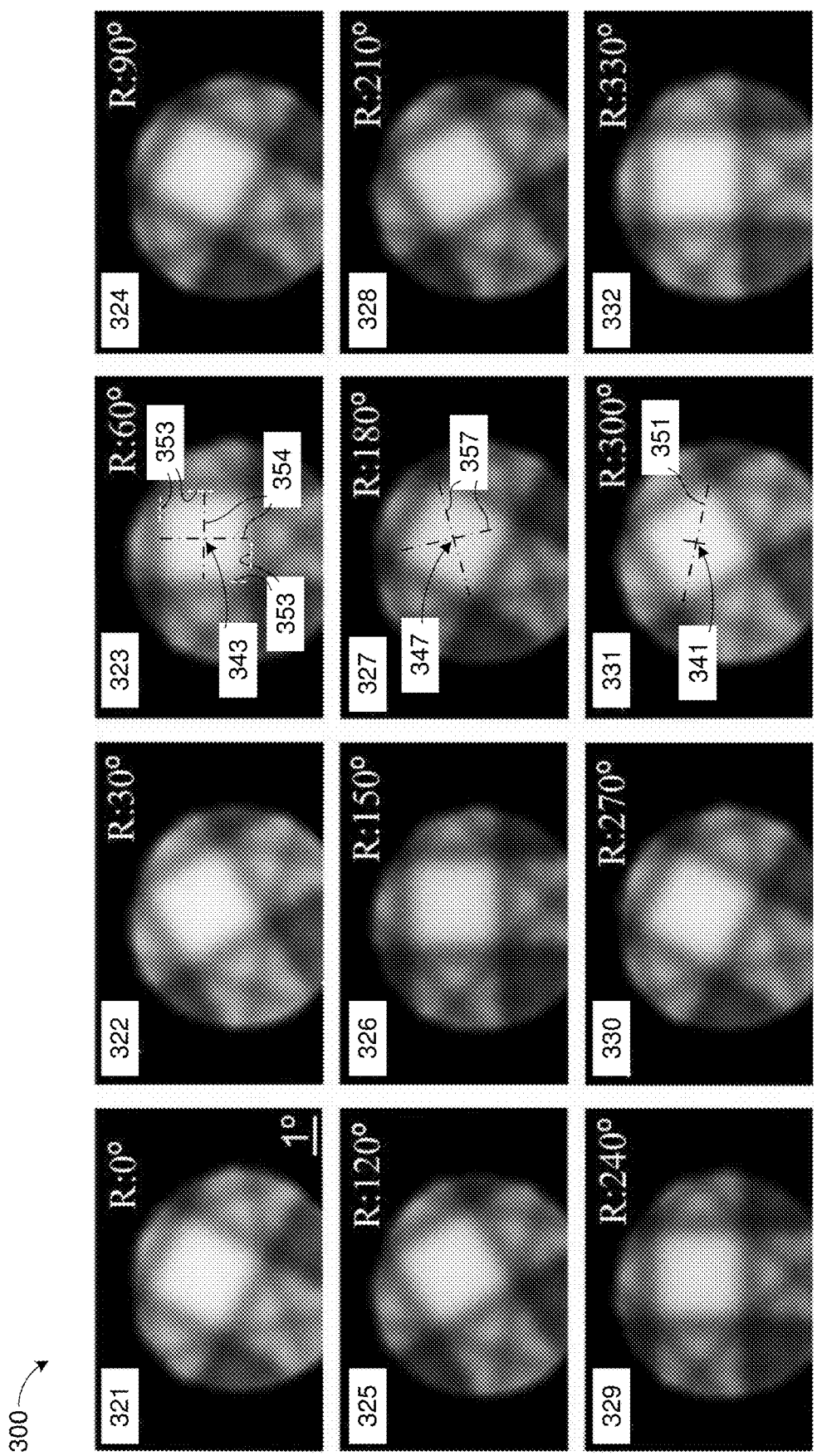
FIG. 3 shows a set of ECP images, for respective azimuthal setpoints, to which the disclosed technologies can be applied.

FIG. 3 shows a set 300 of ECP images 321-332, for respective azimuthal setpoints. Each ECP shows a <100> zone as a bright white square, which corresponds to the enhanced backscattering observed when the incident electron beam is closely aligned to the <100> axis of the sample crystal lattice. The center of the white square identifies the orientation of the <100> zone axis. Each image 321-332 corresponds to a respective azimuthal setpoint with rotation angle R=0°, 30°, 60°, . . . 330° as marked on the respective image 321-332. The magnification of all ECP images 321-332 is the same. These images have a field of view with a diameter of about 5°, as indicated by the 1° scale marking on image 321.

The ECP is observed to rotate clockwise by about 30° for each 30° increment in the azimuthal setpoint. Because of the underlying diamond cubic structure of the imaged silicon wafer sample, the ECP has a four-fold rotational symmetry about the <100> axis, and the ECP orientation substantially repeats after 90° change in the azimuthal setpoint. That is, the ECPs 321, 324, 327, 330 for R=0°, 90°, 180°, and 270° have similar orientation in the plane of the image. Likewise, the ECPs 323, 326, 329, 332 for R=60°, 150°, 240°, and 330° are similarly oriented.

The ECP images 321-332 can be analyzed to determine the zone axis in various ways, some of which are shown in FIG. 3. Image 323 shows edges 353 of the primary zone detected using edge detection techniques. The edges 353 can be used to determine centerlines 354 and the zone axis 343. Then, in image 327, the zone axis 347 is shown determined as the intersection of two diagonals 357 while, in image 331, zone axis 341 is shown determined as the midpoint of a single diagonal 351. The latter technique can be advantageous where one corner of the central zone is outside the field of view. Other techniques can also be used. For example, the zone axis can be determined as the centroid of the bright square of the primary zone.

Figure 4:
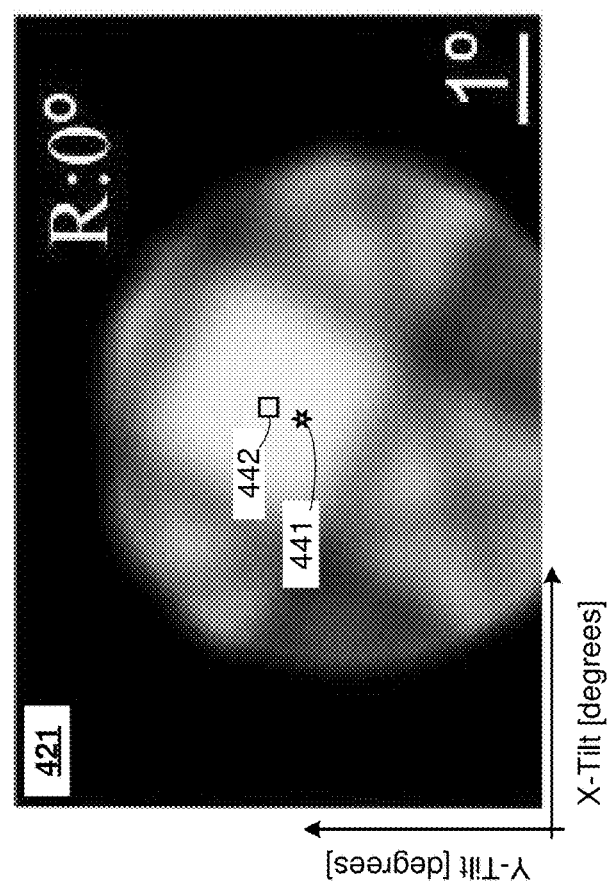
FIG. 4 is an example annotated ECP image, to which the disclosed technologies can be applied.

FIG. 4 is an example annotated ECP image 421, for the same conditions as ECP image 321 of FIG. 3. ECP image 421 can be described with reference to mutually orthogonal XYZ Cartesian axes as described in context of FIG. 1, with a Z axis normal to the top surface of the sample, upon which the electron beam is incident. Then, the X and Y axes can be situated in the plane of the sample surface. The ECP image is presented in coordinates of X-Tilt (degrees) and Y-Tilt (degrees), which are the tilt angles of the incident electron beam in the XZ and YZ planes respectively, relative to the Z axis. Also marked on ECP image 421 are the [0 0 1] zone axis 441 and image center 442. Zone axis 441 can be determined by any of various methods such as described in context of FIG. 3. Image center 442 is a geometric center of ECP image 421.

Figure 5:
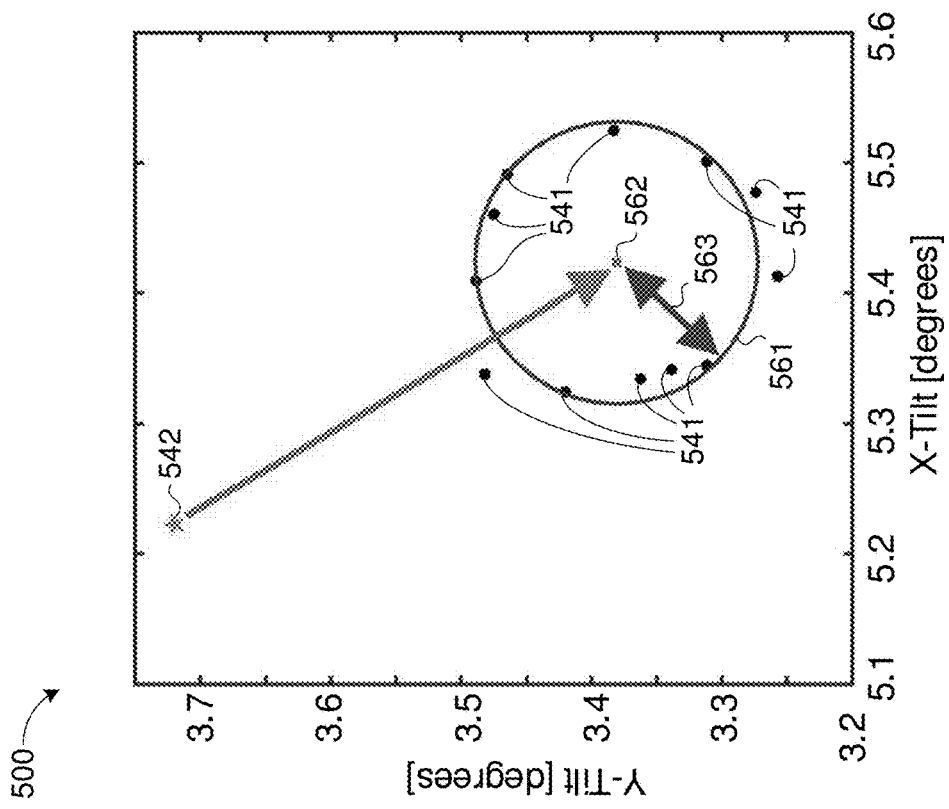
FIG. 5 is a chart illustrating a first example application of the disclosed technologies.

FIG. 5 is a chart 500 illustrating a first example application of the disclosed technologies, using ECP images (such as those of FIG. 3) from multiple azimuthal setpoints. Chart 500 consolidates zone axis measurements 541 from the several ECP images on a common set of X-Tilt and Y-Tilt axes. Image center 542, common to all ECP images, is also shown for reference. The zone axis points 541 describe a circular locus 561, which can be determined by fitting a circle to the several zone axis points 541. The circle's center 562 is dubbed a "rotation center" and is a point on the ECP images that remains stationary as the azimuthal setpoint is changed. The orientation (direction) of the rotation center can be the same as the axis around which azimuthal rotation is performed. The angular coordinates of the rotation center represent a relative offset between electron beam coordinates and stage coordinates. Thus, the rotation center can be seen as a "beam center" in a stage coordinate system, or can be seen as a "stage rotation axis" in an electron beam coordinate system.

Finally, radius 563 of circular locus 561 is the offcut angle of the sample. To illustrate, consider a planar sample mounted on a stage, such that the stage rotation axis is orthogonal to the top surface of the sample, upon which an electron beam is directed. If the sample has a zone axis tilted 1° from the stage rotation axis (which is also 1° from the normal to the sample surface), then its zone axis 541 is offset 1° from the stage rotation axis 562 for any azimuthal setpoint. That is, the zone axis 541 describes a circle 561 having a radius 563 of 1° as the azimuthal setpoint is varied. In a special case where the zone axis is aligned with the stage rotation axis (e.g. offcut angle equal to 0°), circle 561 collapses to the rotation center 562.

Example Apparatus

Figure 6:
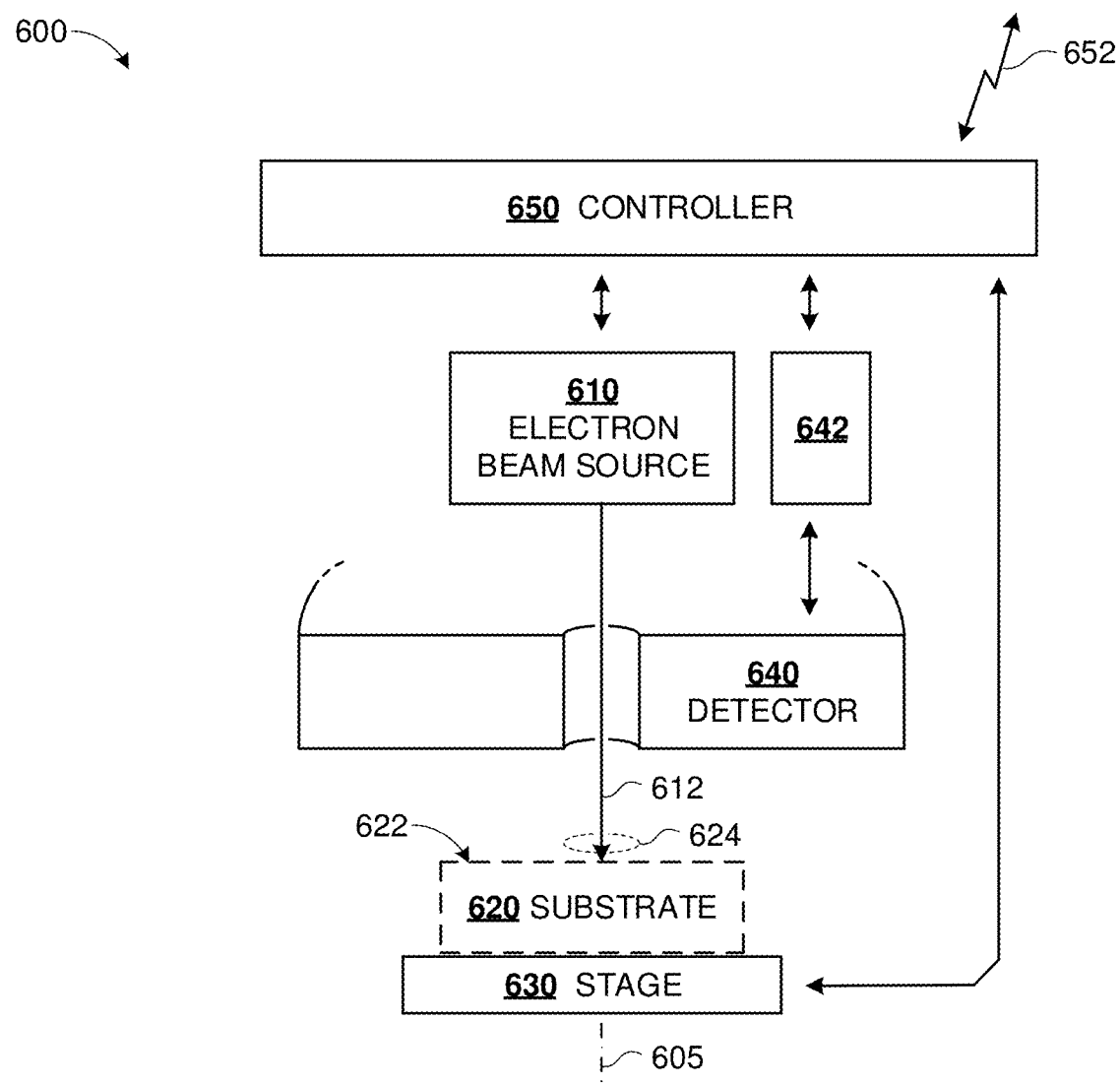
FIG. 6 is a diagram of an example apparatus for determining the offcut angle according to the disclosed technologies.

FIG. 6 is a diagram 600 of an example apparatus for determining offcut angle according to the disclosed technologies. The apparatus delivers an incident beam of electrons to a sample surface, and detects resulting backscattered electrons. As the beam is scanned over a region of interest (ROI), the angle of incidence varies and an electron channeling pattern can be obtained from the backscattered electrons.

An electron beam source 610 can be configured to direct an electron beam 612 to a surface 622 of a sample 620. Electron beam 612 can be scanned over ROI 624 on the surface 622. Sample 620 can be secured on stage 630. Electron detector 640 can be configured to detect backscattered electrons from surface 622. The backscattered electron current from detector 640 can be measured by ammeter 642.

Controller 650 can be coupled to electron beam source 610 or stage 630 to vary an azimuthal setpoint at which the electron beam is incident on sample 620. Controller 650 can also be coupled to detector 640 through ammeter 642, to receive measurements of backscattered electron current, which can be processed to produce electron channeling patterns. The electron channeling patterns for respective azimuthal setpoints can be analyzed to determine a locus of a given zone axis as the azimuthal setpoint is varied, and an offcut angle of the sample can be determined based on this locus.

Numerous extensions or variations of the illustrated apparatus can be implemented within the scope of the disclosed technologies. In some examples, detector 640 can be a backscatter electron detector (BSD) which can be a single-segment detector, or a multi-segment detector with 2 to 16 segments. Segments of a multi-segment BSD 640 can have independent ammeters 642, or can be wired together into one or more groups, with a respective ammeter 642 for each of the group(s). Electron beam 612 can be scanned over ROI 624, leading to variation of the angle of incidence and consequent variation of backscattered electron current due to angle-dependent electron channeling. In other examples, detector 640 can be a pixelated EBSD (diffraction detector) having at least 100 pixels. The backscatter current received at each pixel of EBSD 640 can be accumulated as a charge at each pixel and the pixel charges can be read out sequentially using pixel array readout electronics 642 in lieu of an ammeter. In such examples, electron beam 612 can be maintained at a spot without scanning. The illustrated apparatus can be part of an analytic instrument incorporating an SEM system (e.g. a scanning electron microscope) of which electron beam source 610 is a component. Controller 650 can have a wired or wireless network interface for connection 652 with a remote computer or control station. In varying examples, electron beam source 610 can include a high brightness electron gun with a field emission cathode or a $LaB_6$ cathode. Electron beam 612 can be configured to have a beam convergence angle less than 5, 10, or 20 mrad at the sample surface. The current of electron beam 612 can be in a range 1-2 nA, 0.5-5 nA, or 0.2-10 nA. In some examples, stage 630 can provide tilt. The tilt can be eucentric.

First Example Method

Figure 7:
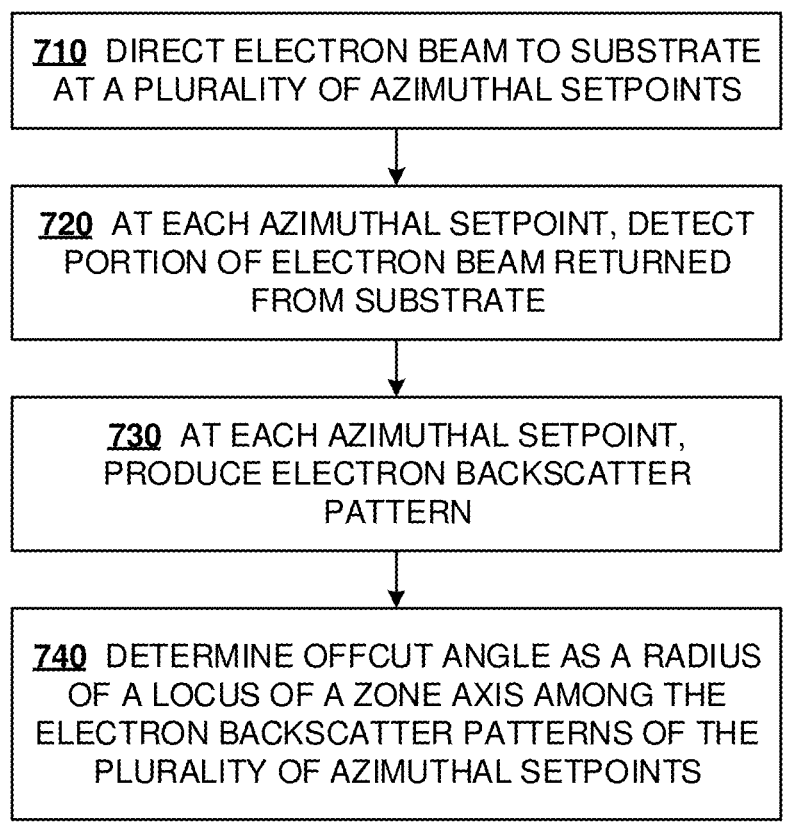
FIG. 7 is a flowchart of a first example method for determining offcut angle according to the disclosed technologies.

FIG. 7 is a flowchart 700 of a first example method for determining offcut angle according to the disclosed technologies. In this method, a relative azimuthal scan is performed between a substrate and an incident electron beam. A locus of a zone axis is used to determine an offcut angle of the substrate.

At process block 710, an electron beam can be directed to a substrate sequentially at multiple azimuthal setpoints. For each of the azimuthal setpoints, a portion of the electron beam returned from the sample can be detected at block 720 and, based on the detection portion of the electron beam, an electron backscatter pattern can be produced at block 730. As described herein, a position of the zone axis in the sequence of electron backscatter patterns can traverse a circular locus. Then, at process block 740, the offcut angle can be determined as a radius of the locus of the zone axis, among the electron backscatter patterns.

Numerous extensions or variations of the first method can be implemented within the scope of the disclosed technologies. The azimuthal setpoint can have azimuthal coordinates relative to a reference plane normal to a surface of the substrate. In some examples, the azimuthal setpoints can be traversed by rotating the substrate, while the reference plane and an orientation of the electron beam remained fixed. In other examples, the azimuthal setpoints can be traversed by rotating a centroid of the electron beam, relative to the reference plane, while the substrate remains stationary. In varying examples, two, three, or more azimuthal setpoints can be used to determine the locus of the zone axis. Two azimuthal setpoints 180° apart can establish a diameter of the circular locus, from which the center and radius of the circle can be determined. Three distinct azimuthal setpoints at any angular separation, or at about 120° intervals, can uniquely determine the circular locus. More than three azimuthal setpoints can be used to reduce sensitivity to measurement noise and improve accuracy. In some examples, the zone axis can have a <100> or <111> orientation.

In further examples, the azimuthal orientation of the offcut angle can also be determined. This can be illustrated in a configuration having Cartesian X, Y, Z axes in a non-rotating laboratory reference frame, with a rotation stage providing azimuthal rotation about the Z axis for a sample mounted thereon, and a major surface of the sample oriented in the XY plane. Considering for purpose of illustration that axes are centered at the rotation center (i.e. rotation center corresponds to X-Tilt=Y-Tilt=0°). Then, an azimuthal rotation of 0 can bring the zone axis onto the X axis (Y-Tilt=0°), from which offcut orientation can be determined as −θ relative to the X direction.

In other examples, analysis of the electron backscatter patterns produced at block 730 can determine that the zone axis has maximum X-Tilt at an azimuthal angle θ. Then, the offcut orientation can be determined as −θ relative to the X direction (when the sample is at azimuthal angle of 0°). Because of electron path rotation in a magnetic field, determination of offcut orientation can be performed without magnetic fields in a sample chamber, or by compensating for magnetic field rotation.

In some examples, blocks 710-720 can be performed with the electron beam directed to a first location on the substrate. Subsequently, blocks 710-740 can be performed at a second location on the substrate. In this way, variations of the offcut angle or orientation over the substrate surface can be determined. In other examples, blocks 710-720 can be performed at a given location on the substrate surface at a first time. Subsequently, blocks 710-740 can be performed at the given location at a second time. In this way, a change in the offcut due to a manufacturing or analysis operation can be determined.

In some examples, an initial electron backscatter pattern can be produced prior to block 710, e.g. by directing the electron beam to the substrate and detecting amounts of the electron beam returned from the substrate. Responsive to determining that the zone axis is absent from the field of view of the initial electron backscatter pattern, a magnification of the electron beam can be reduced, so as to bring the zone axis within an expanded field of view at the reduced magnification. Then, the zone axis locus and offcut angle can be determined through performance of process blocks 710-740.

In some examples, detection at block 720 can be performed by a backscatter electron detector (BSD), and the solid angle range of the electron backscatter pattern can be obtained by scanning the angle of incidence of the electron beam on the substrate surface. In other examples, detection at block 720 can be performed by a pixelated EBSD detector. The solid angle range of the electron backscatter pattern can be covered by the range of pixel positions of the EBSD detector, while the incident electron beam is held stationary.

Second Example Application and Method

Figure 8:
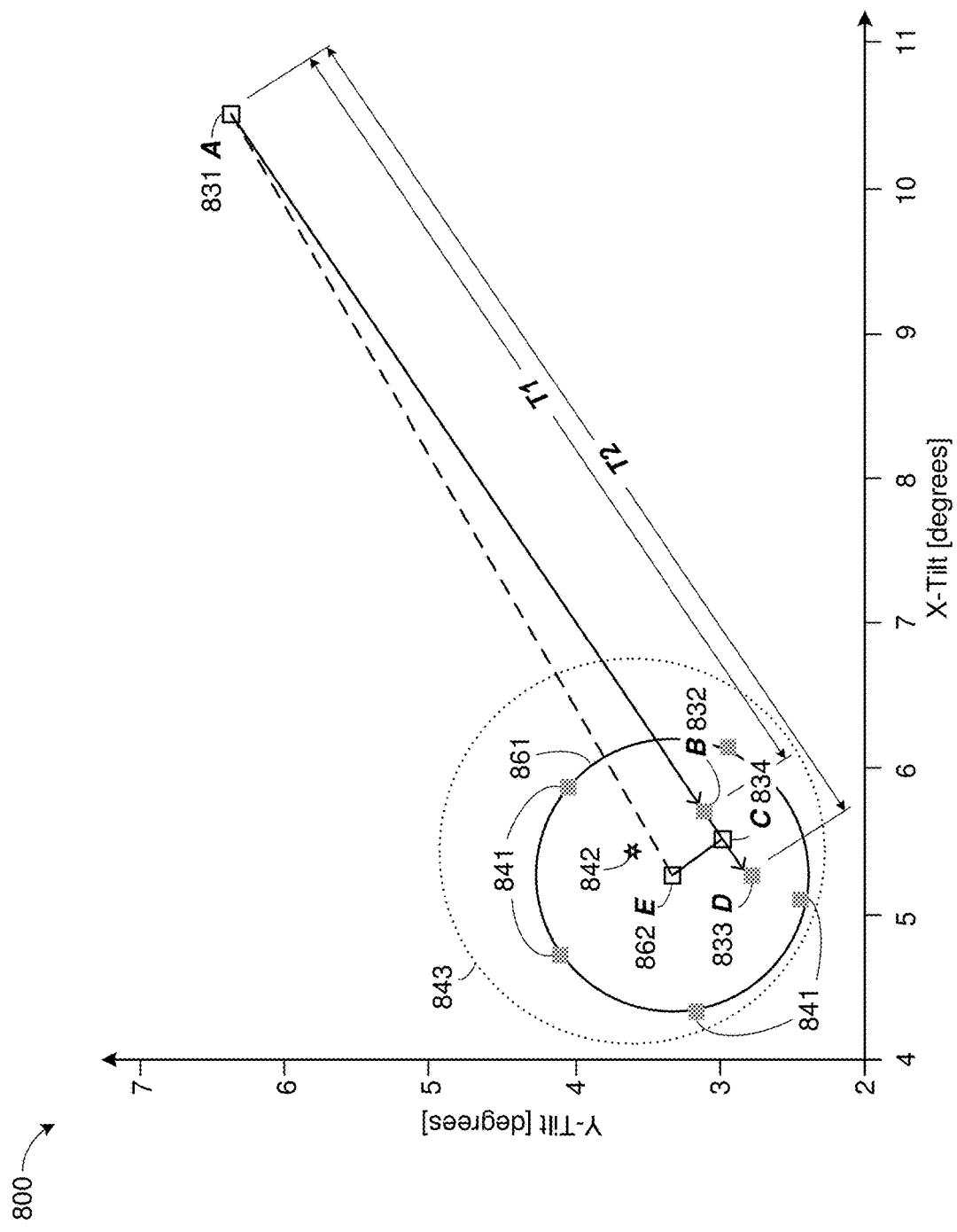
FIG. 8 is a diagram illustrating a second example application of the disclosed technologies.

FIG. 8 is a chart 800 illustrating a second example application of the disclosed technologies. In this application, a tilt technique is used to determine the offcut angle when the desired zone axis is outside an initial field of view. Chart 800 shows various entities plotted on axes of X-Tilt and Y-Tilt similar to FIG. 5. An electron backscatter apparatus is configured to process electron backscatter current data to produce ECPs with image center 842 and a field of view 843.

For purpose of illustration, the desired zone axis 831 is shown as point A, located well outside field of view 843. An initial ECP, obtained without application of any tilt or azimuthal rotation, can be used to determine that zone axis 831 is absent from the field of view of the ECP. At the time of producing the initial ECP, coordinates of image center 842 and its field of view 843 may be known. The objective is to determine or estimate the offcut angle, namely the length of line AE on chart 800, where point E is the rotation center 862. However, the coordinates A, E may not be known initially.

To determine coordinates E of rotation center 862, an arbitrary feature 841 in the initial ECP can be selected, corresponding to some crystallographic orientation different from zone axis 831. Then, a scan of azimuthal setpoints can be performed to determine a locus 861 of feature 841. The center of locus 861 can be identified as coordinates E of rotation center 862.

To determine coordinates A of zone axis 831, a first tilt T1 can be applied to bring zone axis 831 into the field of view 843. An ECP can be produced with first tilt applied, to determine coordinates B of the tilted zone axis 832. If coordinates B are within a predetermined tolerance of rotation center 862 E, the applied tilt T1 can be used directly as the offcut angle. In other examples, a second tilt T2 can be applied to incrementally shift the zone axis in the field of view. Another ECP can be produced to determine coordinates D of the further tilted zone axis 833. Tilts T1, T2 can be in a same vertical plane.

The coordinates B, D of tilted zone axes 832, 833 can be used to extrapolate coordinates A of zone axis 831 in its initial orientation. With coordinates A, E known, the offset can be determined as the length AE, in degrees or in another angular unit.

As an alternative, coordinates E, B, D can be used to determine coordinates C on line BD, such that EC is perpendicular to BD. Then coordinates B, D corresponding to tilts T1, T2 can be used to interpolate (or extrapolate) the tilt T3 corresponding to coordinate C. Tilt T3 can be used as an estimate of the offcut angle AE. As an illustration, if T1=6.00° and T2=6.20°, then interpolation of C along BD can determine T3 as 6.08°.

Figure 9:
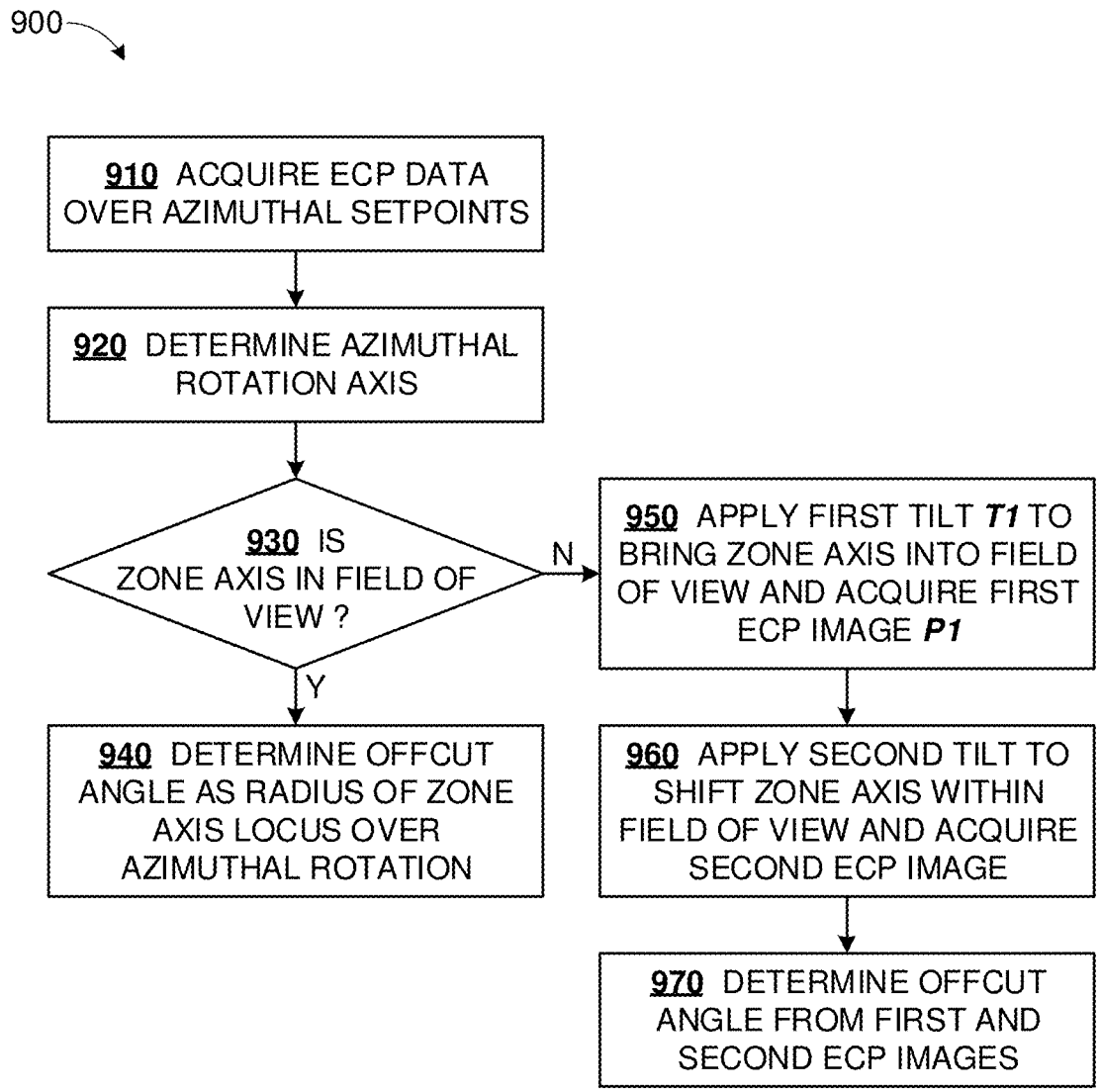
FIG. 9 is a flowchart of a second example method for determining offcut angle according to the disclosed technologies.

FIG. 9 is a flowchart 900 of a second example method for determining offcut angle according to the disclosed technologies. This method combines features of the azimuthal rotation technique and the tilt technique.

At process block 910, ECP data can be acquired over a series of azimuthal setpoints. At block 920, the azimuthal rotation axis can be determined from the ECP data. In examples, coordinates of a representative feature can be identified at each of the azimuthal setpoints and fit to a circle (similar to 861 of FIG. 8), whence the center of the fitted circle is the azimuthal rotation center (similar to 862). Alternatively, if the azimuthal setpoints are evenly spaced over [0°, 360°], then the centroid of these coordinates can be used as the rotation center without performing a fit.

At decision block 930, a determination can be made whether the zone axis is within the field of view of the series of ECPs. If the zone axis is within the field of view of all ECPs acquired at block 910, then the method can follow the Y branch to block 940, where the zone axis coordinates in all the ECPs can be fitted to a circle, and the offcut angle can be determined as the radius of the circle. That is, block 940 can be similar to block 740 of FIG. 7. In some examples, the representative feature at block 920 can be the zone axis itself, and the same fitted circle can be used at both blocks 920, 940 while, in other examples, a different feature can be used at block 920.

If the zone axis is not in the field of view of any of the series of ECPs, then the method can follow the N branch from block 930 to block 950. At block 950, a first tilt T1 can be applied to bring the zone axis into the ECP field of view, similar to the shift from A to B in FIG. 8. A first ECP image P1 can be acquired at tilt T1. Then, at block 960, a second tilt T2 can be applied to shift the zone axis within the field of view, and another ECP image P2 can be acquired at T2. Tilts T1, T2 can be in a same plane (i.e. about a same axis). At block 960, the offcut angle can be determined from ECP images P1, P2 and the known tilts T1, T2, using one or more techniques as described in context of FIG. 10.

1. Borderline Cases

In this disclosure, a zone axis is considered to be in the field of view if a sufficient region around the zone axis is present in the ECP data to be able to determine the coordinates of the zone axis, and not in the field of view otherwise. To illustrate, if a portion of a primary zone (e.g. zone 211 in FIG. 2) present in an ECP image is sufficient to locate the zone axis (even if not the entire square is visible), then the zone axis is considered to be present in the field of view. If the primary zone is partly visible but insufficient to determine the location of the zone axis in the ECP image, then the zone axis is considered not to be in the field of view.

In some situations, a zone axis may be present in a field of view at some azimuthal setpoints but absent from the field of view at other azimuthal setpoints. Varying embodiments can handle such situations in varying ways.

In some embodiments, the Y branch from decision block 930 can be taken if the zone axis is present in the field of view at all azimuthal setpoints, and the N branch can be taken in all other cases, e.g. if the zone axis is absent in one or more of the ECP images. In other embodiments, the Y branch can be taken if at least two diametrically opposed azimuthal setpoints (i.e. two setpoints having azimuthal coordinates 180° apart) have the zone axis in the field of view, as these can sufficiently determine a diameter of the circular locus of the zone axis. The rotation center can be determined as the midpoint of the diameter, and the offcut angle can be determined as half the length of the diameter. In further embodiments, the Y branch can be taken if at least three azimuthal setpoints have the zone axis in the field of view, because three points (even if not diametrically opposed) can be sufficient to uniquely determine a circle and hence determine the radius of the circle (e.g. the offcut angle) or the center of the circle (e.g. the rotation center). Other criteria can also be defined for choosing the Y branch at block 930. Correspondingly, if the criterion for selecting the Y branch is not met, the method can proceed via the N branch.

2. Determination of Tilt T1

A variety of techniques can be used to estimate the tilt T1 used at block 960.

An efficient approach is to compare an initial ECP image (e.g. from block 910 or block 1042) with a library of ECP data for the crystal of the sample material to determine the orientation of the ECP image relative to the crystal structure.

Alternatively, a sequence of tilts T1 can be scanned, and corresponding ECP data Pi obtained, until the zone axis is found to be in the field of view. A fixed array of tilt setpoints in the X-Tilt, Y-Tilt coordinate space can be scanned. The scan can be performed in stages, using a coarse grid in a first stage and progressively finer grids in subsequent stages, until the zone axis is found in the field of view. Still further, scanning can be combined with varying magnification. Low magnification can be used initially to find the zone axis, and magnification can subsequently be increased to obtain more accurate coordinate measurements.

Example Software Modules

Figure 10:
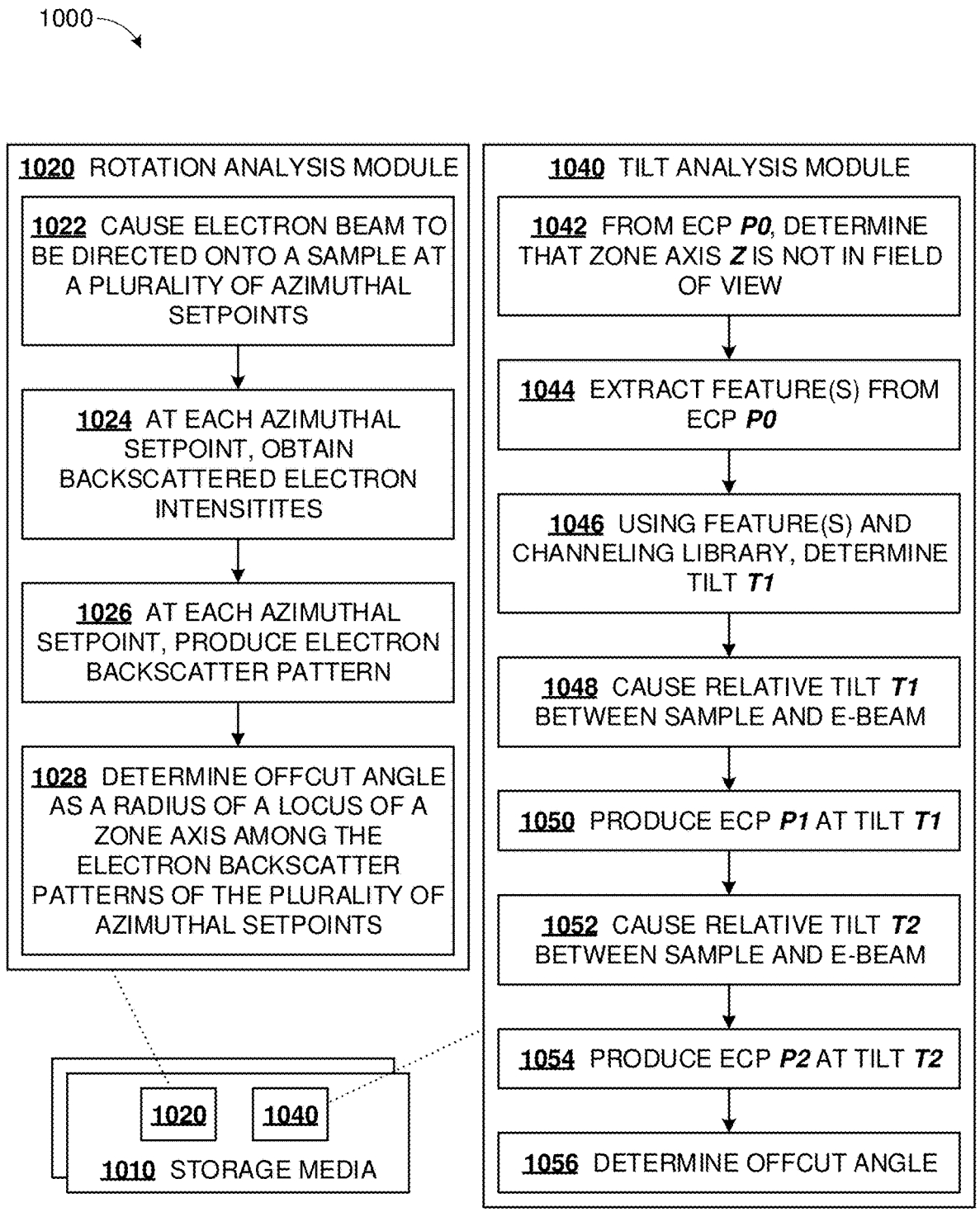
FIG. 10 is a diagram illustrating example software modules for determining offcut angle according to the disclosed technologies.

FIG. 10 is a diagram 1000 illustrating example software modules for determining the offcut angle according to the disclosed technologies. Software (e.g. executable code and/or data) stored on non-transitory media are configured to perform any one or more methods disclosed herein.

As shown, one or more non-transitory computer-readable media 1010 store software modules 1020, 1040 for rotation analysis and tilt analysis respectively. Software modules 1020, 1040 are illustrative. In varying examples, either one or both of modules 1020, 1040 can be stored on media 1010 and, in further examples, either module can be varied in numerous ways including but not limited to those described herein.

Rotation analysis module 1020 can be configured to perform a sequence of operations 1022-1028 as shown. Instructions for block 1022 can cause an electron beam to be directed onto a sample at a plurality of azimuthal setpoints. The azimuthal setpoints can have azimuthal coordinates defined relative to a crystal lattice of the sample. Instructions for block 1024 can obtain backscattered electron intensities at each of the azimuthal setpoints. The instructions for block 1026 can produce electron backscatter patterns for each of the azimuthal setpoints, e.g. by processing the backscattered electron intensities. Then, the instructions for block 1028 can determine an offcut angle of the sample based on the electron backscatter patterns. The offcut angle can be determined as a radius of a locus of a zone axis, among the electron backscatter patterns for the plurality of azimuthal setpoints.

Tilt analysis module 1040 can be configured to perform some or all of operations 1042-1056. The instructions of block 1042 can determine that a given zone axis Z is not in the field of view of an initial electron channeling pattern (ECP) P0. The instructions of block 1044 can extract one or more features from ECP P0. Using these feature(s) and a library of electron channeling data for the crystal lattice of an instant sample, the instructions of block 1046 can estimate an existing tilt of the sample, and can thereby determine a compensatory tilt T1 to bring the zone axis into the field of view. The instructions of block 1048 can cause tilt T1 to be applied between the sample and the electron beam. Then, another ECP P1 can be produced at the applied tilt T1 by the instructions of block 1050. The instructions of block 1052 can cause a second relative tilt T2 to be applied between the sample and the electron beam, and the instructions of block 1054 can produce a corresponding ECP P2. Finally, the instructions of block 1056 can determine the offcut angle based at least in part on tilt T1. In some examples, the offcut angle can be determined by interpolation between zone axis positions in ECP P1, P2 while, in other examples, the offcut angle can be determined by extrapolation from zone axis positions in ECP P1, P2.

Numerous extensions or variations of the illustrated modules can be implemented within the scope of the disclosed technologies. The instructions of block 1028 can determine the position of the given zone axis in each of the electron channeling patterns for the azimuthal setpoints scanned, and can fit a circle to these positions. The offcut angle can be determined as the radius of the fitted circle.

Example Configurations

Because the electron channeling pattern is dependent on the relative orientation between an incident electron beam and a sample, rotations or tilts described herein can be applied in various configuration, illustrated in FIGS. 11-14.

FIG. 11 is a diagram 1100 illustrating a first example configuration for azimuthal rotation according to the disclosed technologies. In this basic configuration, sample 1120 and electron beam 1112 are aligned. Azimuthal rotation between setpoints can be performed by rotating the sample (indicated by arrow 1125) about axis 1105, e.g. on a rotation stage (not shown). BSD 1140 is annularly situated around electron beam 1112.

FIG. 12 is a diagram 1200 illustrating a second example configuration providing tilt and azimuthal rotation between sample 1220 and electron beam 1212. In this configuration, azimuthal rotation from one setpoint to another can be performed by rotating sample 1220 about axis 1205, e.g. on a tilt-and-rotation stage (not shown). Arrow 1225 indicates the azimuthal rotation. The tilt-and-rotation stage can also tilt the sample as indicated by arrow 1227. BSD 1240 is annularly situated around electron beam 1212.

FIG. 13 is a diagram 1300 illustrating a third example configuration for tilt and azimuthal rotation between sample 1320 and electron beam 1312. In this configuration, azimuthal rotation from one setpoint to another can be performed by rotating sample 1320 about axis 1305, e.g. on a rotation stage (not shown). Arrow 1325 indicates the azimuthal rotation. Tilt can be applied (as indicated by arrow 1317) by steering electron beam 1312. BSD 1340 is annularly situated around electron beam 1312.

FIG. 14 is a diagram 1400 illustrating a fourth example configuration for tilt and azimuthal rotation between sample 1420 and electron beam 1412. In this configuration, azimuthal rotation from one setpoint to another can be performed by rotating electron beam 1412 about axis 1405, e.g. by steering electron beam 1412. Arrow 1425 indicates the azimuthal rotation. Tilt can also be applied (as indicated by arrow 1417) by steering electron beam 1412. BSD 1440 is annularly situated around electron beam 1412.

Third Example Application

Figure 15:
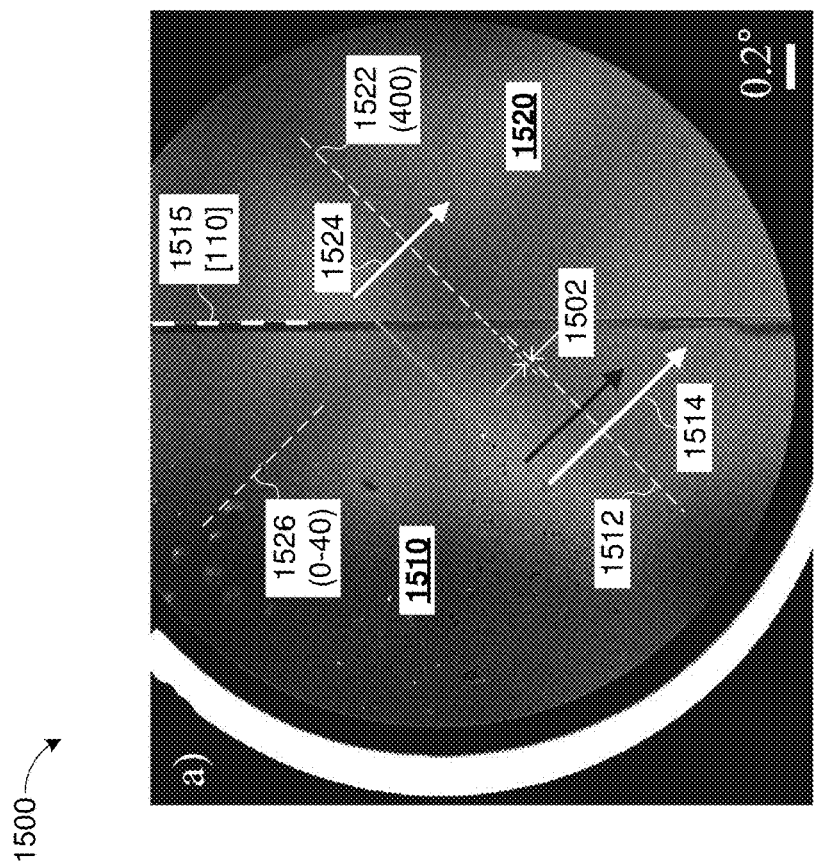
FIG. 15 is an annotated ECP image for a third example application of the disclosed technologies.

FIG. 15 is an annotated ECP image 1500 for a third example application of the disclosed technologies. Crystal defects can cause spatial variations in crystal plane orientations between spatial locations in a crystal. In image 1500, a small misorientation is present between the left and right sides 1510, 1520 of ECP image 1500. Because the ECP data is obtained by scanning the electron beam across a region of interest on the sample surface, the angle coordinates (e.g. in degrees) of the ECP image also map 1:1 to length coordinates (e.g. in microns) on the sample surface. Accordingly, in the illustrated example, the left side 1510 is a Silicon-on-nothing (SiON) structure, while the right side 1520 is bulk silicon. Spatial border 1515 between these regions is aligned along a [110] direction as shown. A dark (4 0 0) band 1512, 1522 has a small offset 1502 crossing borderline 1515. To determine offset 1502, linear scans 1514, 1524 can be performed in a direction (0 −4 0), orthogonal to the (4 0 0) band 1512, 1522. Whereas, the entire ECP image 1500 can be obtained through a two-dimensional raster scan of the electron beam over the sample surface, linear scans 1514, 1524 can be restricted to the lines shown. A BSD similar to 640 of FIG. 6 can be used to monitor the backscattered electron current during each linear scan 1514, 1524.

Figure 16:
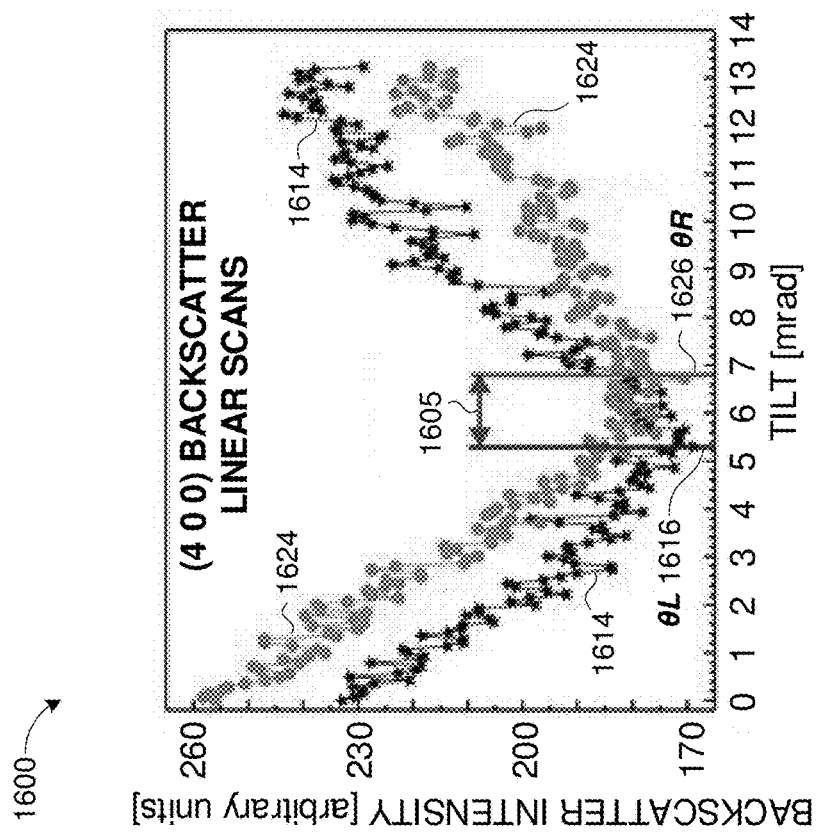
FIG. 16 is a chart of backscatter current measurements illustrating the third example application of the disclosed technologies.

FIG. 16 is a chart 1600 of backscatter intensity (e.g. measured current) during the linear scans 1514, 1524 of FIG. 15. Graph 1614 depicts measurements along scan line 1514, while graph 1624 depicts measurements along scan line 1524. Fitting techniques can be applied to locate the backscatter minimum corresponding to the (4 0 0) band for each graph. A parabolic fit in the region of the minimum can be used, piecewise linear fits on either side of the minimum can be used, or a combination of these or other fitting strategies can be used to determine the angular coordinates θL 1616, θR 1626 of the respective backscatter minima. The difference between these angles |θL−θR| can be evaluated to determine the angular misorientation 1605 across boundary 1515.

A Generalized Computer Environment

Figure 17:
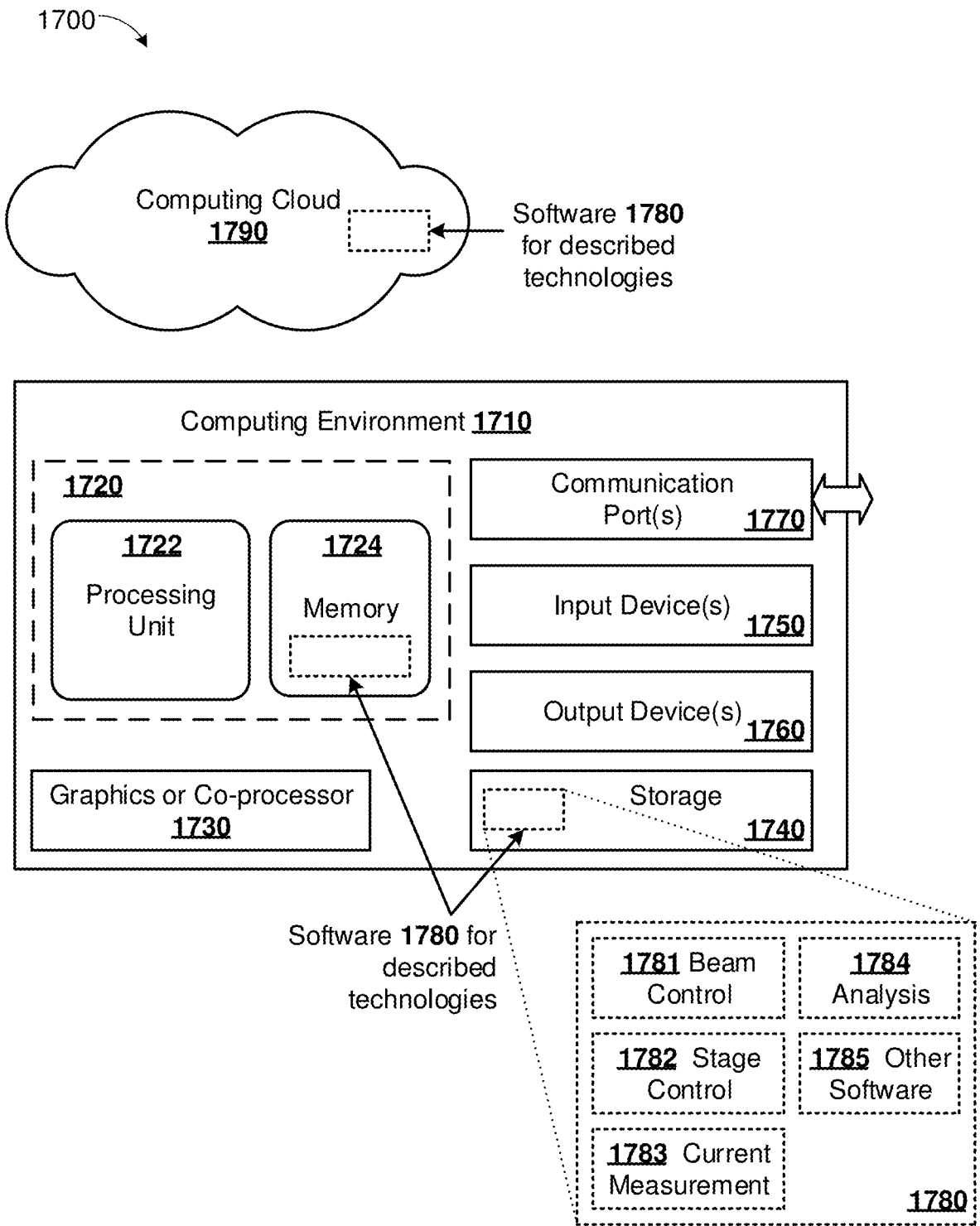
FIG. 17 illustrates a generalized example of a suitable computing environment in which described embodiments, techniques, and technologies pertaining to beam focusing can be implemented.

FIG. 17 illustrates a generalized example of a suitable computing system 1700 in which described examples, techniques, and technologies for determining offcut angle, e.g. by azimuthal rotation or tilt, can be implemented. The computing system 1700 is not intended to suggest any limitation as to scope of use or functionality of the present disclosure, as the innovations can be implemented in diverse general-purpose or special-purpose computing systems. The computing system 1700 can control an SEM system or instrument for electron beam diffraction measurement, can control a stage or electron beam column to apply tilts or rotations between a stage mounted sample and the electron beam, can measure backscatter current or charge, can generate ECP data or images, can analyze ECP data or images to determine offcut angles; or can acquire, process, output, or store measurement data.

With reference to FIG. 17, the computing environment 1710 includes one or more processing units 1722 and memory 1724. In FIG. 17, this basic configuration 1720 is included within a dashed line. Processing unit 1722 can execute computer-executable instructions, such as for control or data acquisition as described herein. Processing unit 1722 can be a general-purpose central processing unit (CPU), a processor in an application-specific integrated circuit (ASIC), or any other type of processor. In a multi-processing system, multiple processing units execute computer-executable instructions to increase processing power. Computing environment 1710 can also include a graphics processing unit or co-processing unit 1730. Tangible memory 1724 can be volatile memory (e.g., registers, cache, or RAM), non-volatile memory (e.g., ROM, EEPROM, or flash memory), or some combination thereof, accessible by processing units 1722, 1730. The memory 1724 stores software 1780 implementing one or more innovations described herein, in the form of computer-executable instructions suitable for execution by the processing unit(s) 1722, 1730. For example, software 1780 can include software 1781 for controlling an electron beam, software 1782 for controlling a rotation or multi-axis stage, software 1783 for measuring electron backscatter current or charge, software 1784 for performing analysis of ECP data, or other software 1785 (including user interface or host interface). The inset shown for software 1780 in storage 1740 can be equally applicable to software 1780 elsewhere in FIG. 17. The memory 1724 can also store control parameters, calibration data, measurement data, an ECP library, or other database data. The memory 1724 can also store configuration or operational data.

A computing system 1710 can have additional features, such as one or more of storage 1740, input devices 1750, output devices 1760, or communication ports 1770. An interconnection mechanism (not shown) such as a bus, controller, or network interconnects the components of the computing environment 1710. Typically, operating system software (not shown) provides an operating environment for other software executing in the computing environment 1710, and coordinates activities of the components of the computing environment 1710.

The tangible storage 1740 can be removable or non-removable, and includes magnetic disks, magnetic tapes or cassettes, CD-ROMs, DVDs, or any other medium which can be used to store information in a non-transitory way and which can be accessed within the computing environment 1710. The storage 1740 stores instructions of the software 1780 (including instructions and/or data) implementing one or more innovations described herein. Storage 1740 can also store image data, measurement data, reference data, calibration data, configuration data, sample data, or other databases or data structures described herein.

The input device(s) 1750 can be a mechanical, touch-sensing, or proximity-sensing input device such as a keyboard, mouse, pen, touchscreen, or trackball, a voice input device, a scanning device, or another device that provides input to the computing environment 1710. The output device(s) 1760 can be a display, printer, speaker, optical disk writer, or another device that provides output from the computing environment 1710. Input or output can also be communicated to/from a remote device over a network connection, via communication port(s) 1770.

The communication port(s) 1770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1710, either as an input device 1750 or coupled to a communication port 1770, and can include analog-to-digital converters or connections to an instrumentation bus. An instrumentation control system can be integrated into computing environment 1710, either as an output device 1760 or coupled to a communication port 1770, and can include digital-to-analog converters, switches, or connections to an instrumentation bus.

In some examples, computer system 1700 can also include a computing cloud 1790 in which instructions implementing all or a portion of the disclosed technology are executed. Any combination of memory 1724, storage 1740, and computing cloud 1790 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "determine" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 17, computer-readable storage media include memory 1724, and storage 1740. The terms computer-readable media or computer-readable storage media do not include signals and carrier waves. In addition, the terms computer-readable media or computer-readable storage media do not include communication ports (e.g., 1770).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. A method, comprising:
   directing an electron beam to a substrate at a plurality of azimuthal setpoints and detecting portions of the electron beam returned from the substrate;
   producing, based on the detected portions of the electron beam, respective electron backscatter patterns for each of the azimuthal setpoints; and
   determining an offcut angle of the substrate as a radius of a locus of a zone axis among the electron backscatter patterns.

2. The method of claim 1, wherein the plurality of azimuthal setpoints comprises at least three azimuthal setpoints.

3. The method of claim 1, wherein the zone axis has a <100>, <110>, or <111> orientation.

4. The method of claim 1, further comprising determining an azimuthal orientation of the offcut angle.

5. The method of claim 1, wherein the azimuthal setpoints have azimuthal coordinates relative to a reference plane normal to a surface of the substrate, and the plurality of azimuthal setpoints is traversed by rotating the substrate.

6. The method of claim 1, wherein the azimuthal setpoints have azimuthal coordinates relative to a reference plane normal to a surface of the substrate, and the plurality of azimuthal setpoints is traversed by rotating a centroid of the electron beam relative to the reference plane while the substrate remains stationary.

7. The method of claim 1, wherein the electron beam is a scanning electron beam of a scanning electron microscope and a given pattern of the electron backscatter patterns is produced by scanning the electron beam across a surface region of the substrate.

8. The method of claim 1, wherein the detecting is performed by a pixelated electron backscattering detector.

9. The method of claim 1, wherein the directing and detecting are performed with the electron beam directed to a first location on the substrate, and the method further comprises repeating the directing, detecting, producing, and determining operations for a second location on the substrate distinct from the first location.

10. The method of claim 1, wherein the directing and detecting are performed at a first time, prior to a manufacturing operation being performed on the substrate, and the method further comprises:
    repeating the directing, detecting, producing, and determining operations after the manufacturing operation.

11. The method of claim 1, further comprising, prior to the directing:
    directing the electron beam to the substrate and detecting amounts of the electron beam returned from the substrate;
    producing, based on the detected amounts of the electron beam, a first electron backscatter pattern having a field of view; and
    responsive to determining that the zone axis is absent from the field of view, reducing a magnification of the electron beam.

12. An apparatus, comprising:
    a rotation stage situated to secure a sample having a crystal lattice;
    an electron beam source situated to direct an electron beam to the sample;
    an electron detector situated to receive portions of the electron beam backscattered from the sample; and
    a controller coupled to at least one of the rotation stage or the electron beam source and configured to:
    vary an azimuthal setpoint at which the electron beam is incident, the azimuthal setpoint having an azimuthal coordinate defined relative to a reference plane containing a rotation axis of the rotation stage;
    process the received portions of the electron beam to produce electron channeling patterns; and
    determine an offcut angle based on a radius of a locus of a zone axis among a plurality of the electron channeling patterns.

13. An analytic instrument comprising a scanning electron microscope and comprising the apparatus of claim 12, wherein the scanning electron microscope comprises the electron beam source.

14. The apparatus of claim 12, wherein the electron detector is a backscatter electron detector having 1 to 16 segments.

15. The apparatus of claim 12, wherein the electron detector is a pixelated electron backscatter diffraction detector having at least 100 pixels.

16. One or more computer-readable media having defined therein executable instructions which, when executed by one or more processors, actuate the one or more processors to:
(a) cause an electron beam to be directed to a sample so as to be incident on the sample at a plurality of azimuthal setpoints, the azimuthal setpoints having azimuthal coordinates defined relative to a crystal lattice of the sample;
(b) obtain associated backscattered electron intensities;
(c) process the backscattered electron intensities to produce respective electron channeling patterns for the plurality of azimuthal setpoints; and
(d) determine an offcut angle of the sample by:
fitting a circle to positions of a given zone axis in the respective electron channeling patterns; and
determining the offcut angle of the sample from a radius of the circle.

17. The computer-readable media of claim 16, wherein the electron channeling patterns are first electron channeling patterns, and the computer-readable media has defined therein further instructions which, when executed by the one or more processors, actuate the one or more processors to:
(e) determine, at least in part from an initial electron channeling pattern, that a given zone axis of the crystal lattice is not in a field of view of the initial electron channeling pattern;
(f) cause a first relative tilt to be applied between the sample and the electron beam;
(g) produce a second electron channeling pattern at the first relative tilt, wherein the given zone axis is in a field of view of the second electron channeling pattern; and
(h) determine the offcut angle of the sample based at least in part on the first relative tilt.

18. The computer-readable media of claim 17, wherein execution of the further instructions further actuates the one or more processors to:
(i) extract one or more features from the initial channeling pattern; and
(j) using the one or more features and a library of electron channeling data for the crystal lattice, determine the first relative tilt.

19. The computer-readable media of claim 17, wherein execution of the further instructions further actuates the one or more processors to:
(k) cause a second relative tilt to be applied between the sample and the electron beam; and
(l) produce a third electron channeling pattern at the second relative tilt;
wherein act (h) comprises interpolation between, or extrapolation from, the first relative tilt and the second relative tilt, using positions of the given zone axis in the second electron channeling pattern and the third electron channeling pattern.

* * * * *